United States Patent
Fukuchi

[19]

[11] Patent Number: 5,963,090
[45] Date of Patent: Oct. 5, 1999

[54] AUTOMATIC PREDISTORTION ADJUSTING CIRCUIT HAVING STABLE NON-LINEAR CHARACTERISTICS REGARDLESS OF INPUT SIGNAL FREQUENCY

[75] Inventor: Akio Fukuchi, Tokyo, Japan

[73] Assignee: NEC Corporation, Tokyo, Japan

[21] Appl. No.: 08/970,147

[22] Filed: Nov. 13, 1997

[30] Foreign Application Priority Data

Nov. 13, 1996 [JP] Japan .................................. 8-301789

[51] Int. Cl.⁶ .............................. H03F 1/26; H03G 3/20
[52] U.S. Cl. ........................................... 330/149; 330/136
[58] Field of Search .................................... 330/136, 149, 330/151; 375/297; 455/63

[56] References Cited

U.S. PATENT DOCUMENTS 5,570,063  10/1996  Eisenberg ............................ 330/151 X
5,760,646   6/1998  Belcher et al. .......................... 330/149

FOREIGN PATENT DOCUMENTS 55-107308  8/1980  Japan .
56-85909   7/1981  Japan .
1-200807   8/1989  Japan .

*Primary Examiner*—Robert Pascal
*Assistant Examiner*—Patricia T. Nguyen
*Attorney, Agent, or Firm*—Foley & Lardner

[57] ABSTRACT

In an automatic predistortion adjusting circuit, a splitter splits an input signal into first and second signals. A predistortion circuit applies first non-linear characteristics to the first signal, a variable attenuator adjusts an amplitude of an output signal of the predistortion circuit, a variable phase shifter adjusts a phase of an output signal of the variable attenuator, and a main amplifier amplifies an output signal of the variable phase shifter, so that second non-linear characteristics opposite to the first non-linear characteristics are applied to an output signal of the main amplifier. A directional coupler takes out a part of an output signal of the main amplifier as a branch signal, and a delay line delays the second signal. An adder adds a delayed signal passed through the dely line to the branch signal. Further, a detector detects an strength of an output signal of the first adder, and a control circuit controls the first non-linear characteristics, an attenuation amount of the variable attenuator and a phase amount of the variable phase shifter in accordance with an output signal of the detector.

19 Claims, 6 Drawing Sheets

AUTOMATIC PREDISTORTION ADJUSTING CIRCUIT HAVING STABLE NON-LINEAR CHARACTERISTICS REGARDLESS OF INPUT SIGNAL FREQUENCY

BACKGROUND OF THE INVENTION

1. Field of the Invention

The present invention relates to an automatic predistortion adjusting circuit.

2. Description of the Related Art

A predistortion circuit is provided to compensate for a non-linear spectrum generated in a high frequency amplifier. In this case, the non-linear characteristics of the predistortion circuit are opposite to those of the amplifier. Generally, the non-linear characteristics of the predistortion circuit are automatically adjusted during the assembly process of the amplifier, and thereafter, the non-linear characteristics of the predistortion circuit are not changed during operation.

A prior art automatic predistortion adjusting circuit is constructed by a predistortion circuit and a main amplifier connected in series. In addition, a directional coupler takes out a part of the output signal of the main amplifier as a branch signal, and a bandpass filter passes the non-linear spectrum of the branch signal. Then, a detector detects the strength of the output of the bandpass filter, and a control circuit controls the non-linear characteristics of the predistortion circuit in accordance with the level of the output signal of the detector, so that this level is minimal, i.e., brought close to zero. This will be explained later in detail.

In the above-described prior art, however, in the case of multi-carriers, although the bandpass filter can pass the non-linear spectrum therethrough wile completely attenuating the desirable spectrum, the passband frequency (stopband frequency) of the bandpass filter depends upon the frequency of the input signal, so that the characteristics of the circuit fluctuate in accordance with the input signal.

On the other hand, in the case of a multi-quadrature amplitude modulation (QAM) signal included in an input signal, a non-linear spectrum such as a third inter-modulation distortion spectrum have a larger bandwidth than that of a desirable spectrum. Therefore, since the frequencies of the non-linear spectrum are superposed onto those of the desirable spectrum, the non-linear spectrum cannot be removed by the bandpass filter. As a result, it is difficult to control the predistortion circuit.

Further, it is difficult to manufacture a bandpass filter having ideal bandpass characteristics suitable for the automatic predistortion adjusting circuit.

SUMMARY OF THE INVENTION

It is an object of the present invention to provide an automatic predistortion adjusting circuit capable of carrying out a stable predistortion operation regardless of the frequency of an input signal.

According to the present invention, in an automatic predistortion adjusting circuit, a splitter splits an input signal into first and second signals. A predistortion circuit applies first non-linear characteristics to the first signal, a variable attenuator adjusts an amplitude of an output signal of the predistortion circuit, a variable phase shifter adjusts a phase of an output signal of the variable attenuator, and a main amplifier amplifies an output signal of the variable phase shifter, so that second non-linear characteristics opposite to the first non-linear characteristics are applied to an output signal of the main amplifier. Also, a directional coupler takes out a part of an output signal of the main amplifier as a branch signal, and a delay line delays the second signal. Then, an adder adds a delayed signal passed through the delay line to the branch signal. Further, a detector detects a strength of an output signal of the first adder, and a control circuit controls the first non-linear characteristics, an attenuation amount of the variable attenuator and a phase amount of the variable phase shifter in accordance with an output signal of the detector.

Thus, the output signal of the adder includes only the non-linear spectrum generated by the predistortion circuit and the main amplifier regardless of the frequency of the input signal, and therefore, a stable predistortion oepration can be carried out regardless of the frequency of the input signal.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENTS

Before the description of the preferred embodiments, a prior art automatic predistortion adjusting circuit will be explained with reference to FIGS. 1, 2A, 2B, 3, 4A and 4B.

Figure 1:
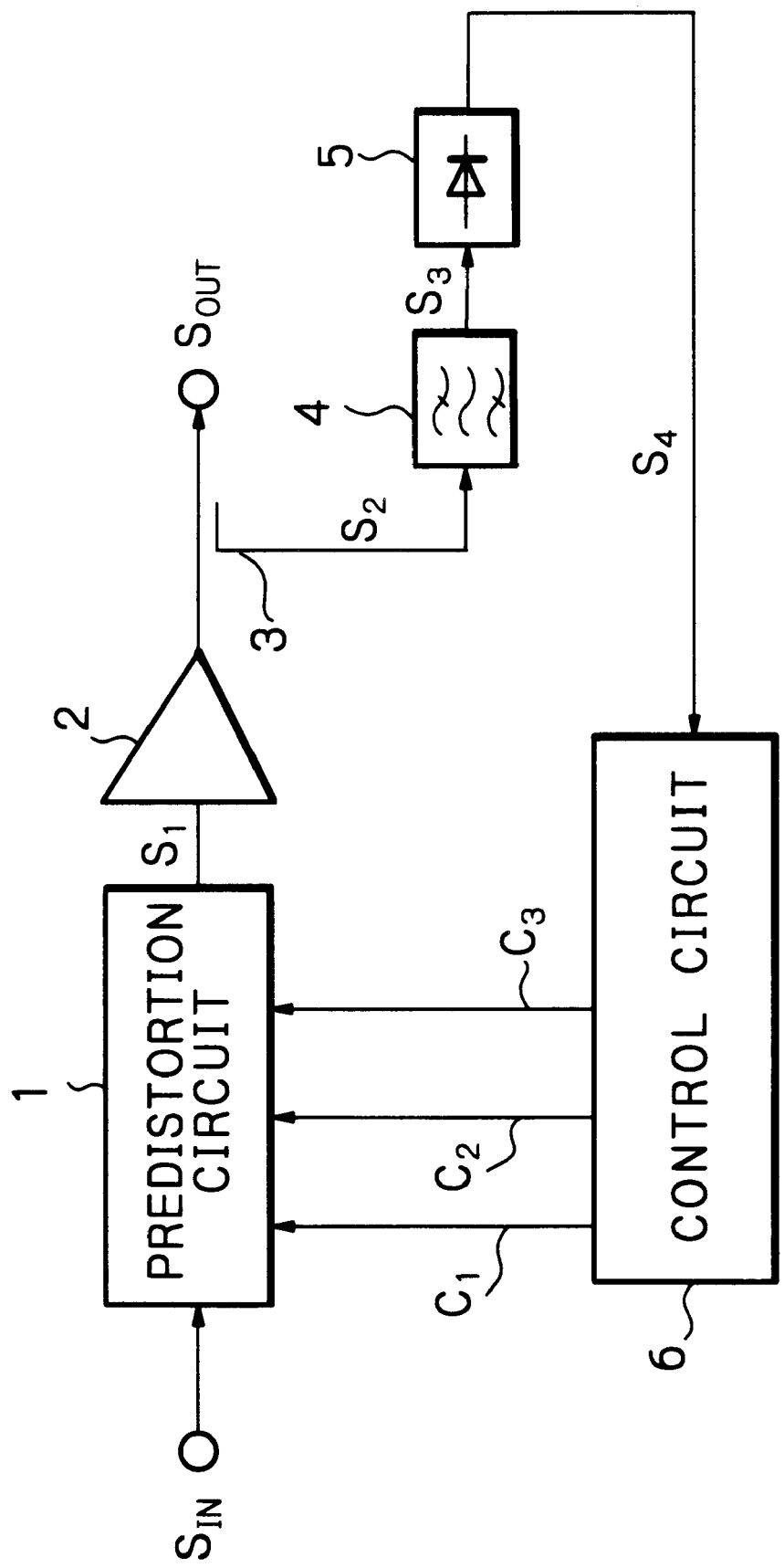
FIG. 1 is a circuit diagram illustrating a prior automatic predistortion adjusting circuit.
Figure 2A:
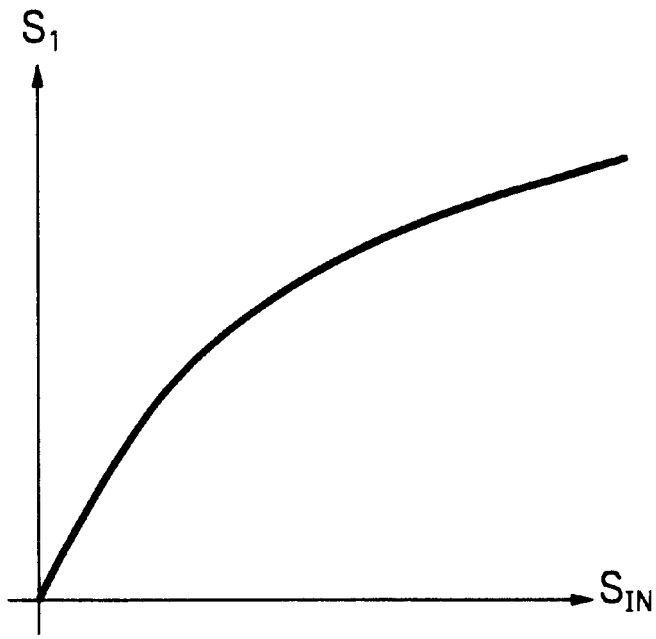
FIGS. 2A and 2B are graphs showing input/output characteristics of the predistortion circuit and the main amplifier of FIG. 1.
Figure 2B:
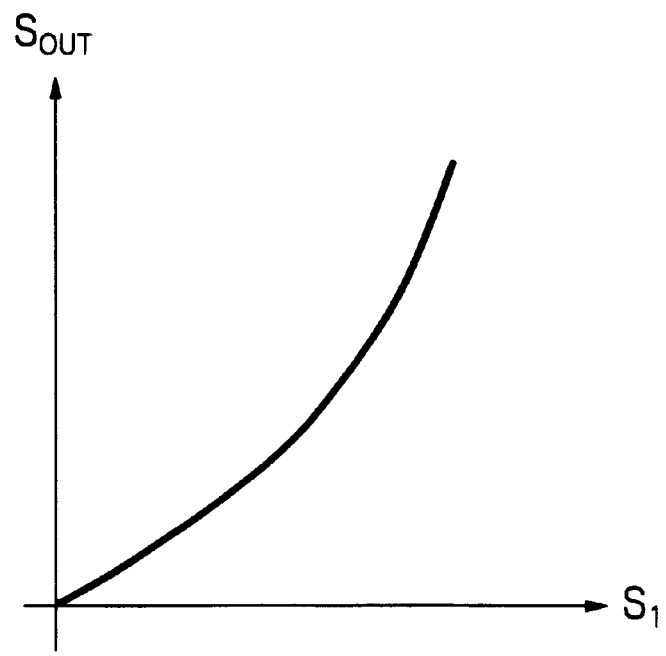

In FIG. 1, a predistortion circuit 1 and a main amplifier 2 form an amplifier for receiving an input signal $S_{IN}$ to generate an output signal $S_{OUT}$. In this case, the non-linear characteristics of the predistortion circuit 1 as shown in FIG. 2A are opposite to the non-linear characteristics of the main amplifier 2 as shown in FIG. 2B. Therefore, the two non-linear characteristics are compensated for by each other, so that the distortion level of the output signal $S_{OUT}$ can be minimized. In FIGS. 2A and 2B, note the $S_1$ designates an output signal of the predistortion circuit 1.

Also, in FIG. 1, reference numeral 3 designates a directional coupler for taking out a part of the output signal $S_{OUT}$ as a branch signal $S_2$, 4 designates a bandpass filter for passing only the third inter-modulation distortion spectrum of the branch signal $S_2$ of the output signal $S_{OUT}$ as a signal $S_3$, and 5 designates a detector for detecting the strength of the third inter-modulation distortion spectrum $S_3$ of the output signal $S_{OUT}$.

A control circuit 6, which is constructed by a microcomputer or the like, receives an output signal $S_4$ of the detector 5 to control the characteristics of the predistortion circuit 1, so that the level of the output signal $S_4$ of the detector 5 is minimal, i.e., brought close to zero by a feedback loop formed by the elements 1, 2, 3, 4, 5, and 6.

Figure 3:
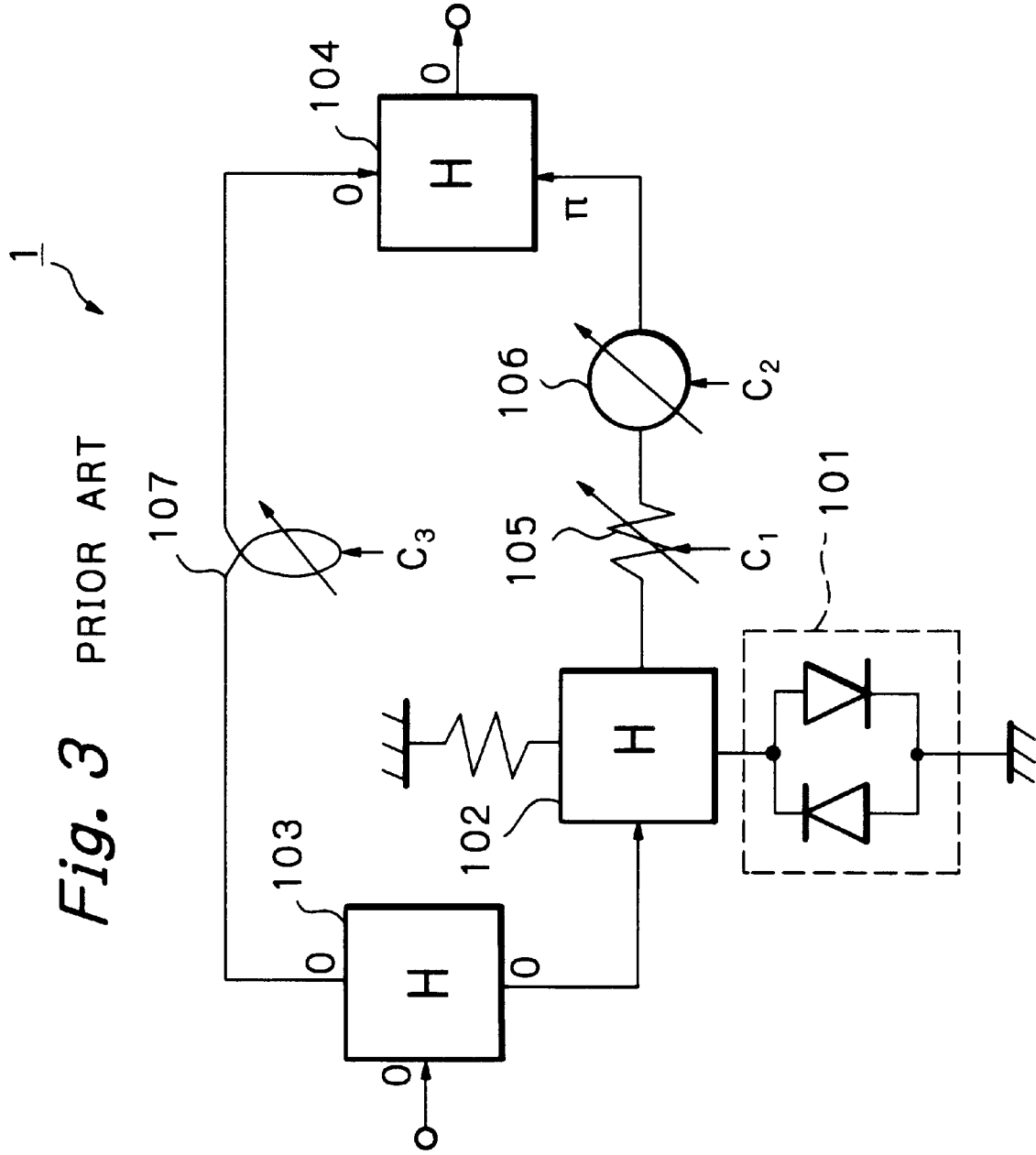
FIG. 3 is a detailed circuit diagram of the predistortion circuit of FIG. 1.

The control circuit 6 generates control signals $C_1$, $C_2$ and $C_3$ and transmits them to the predistortion circuit 1, thus changing the non-linear characteristics of the predistortion circuit as illustrated in detail in FIG. 3. That is, the predistortion circuit 1 is constructed by a distortion generating circuit 101, hybrid circuits 102, 103 and 104, a variable attenuator 105, a variable phase shifter 106 and a variable delay line 107. The values of the variable attenuator 105, the variable attenuator 106 and the variable delay line 107 are controlled by the control signals $C_1$, $C_2$ and $C_3$ generated from the control circuit 6.

Figure 4A:
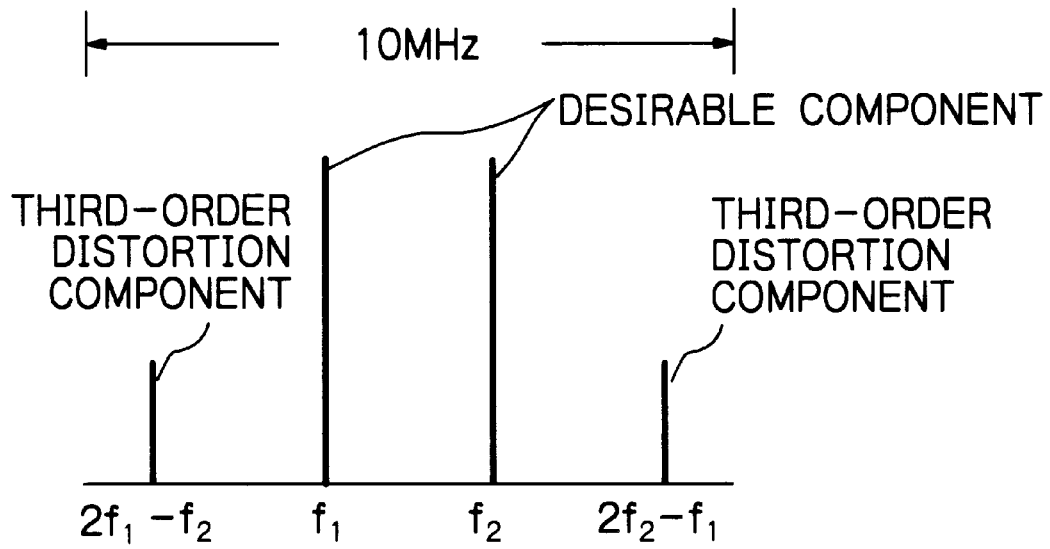
FIGS. 4A and 4B are graphs showing frequency spectrums of the output signal of the circuit of FIG. 1.

An example of a frequency spectrum of the output signal $S_{OUT}$ of FIG. 1 is shown in FIG. 4A where multi-carriers such as two tones are included in the input signal $S_{IN}$. In this case, when a signal of a frequency $f_1$ and a signal of a frequency $f_2$ are distorted at the amplifier (1, 2), an inter-modulation distortion is generated, so that non-linear spectrum other than the desirable spectrum ($f_1$, $f_2$) are generated in the output signal $S_{OUT}$. In FIG. 4A, note that only third inter-modulation distortion spectrum having frequencies of $2f_1-f_2$ and $2f_2-f_1$ are shown. Such a non-linear spectrum can be removed by the bandpass filter 4.

However, in the case of multi-carriers, although the bandpass filter 4 can pass the non-linear spectrum therethrough while completely attenuating the desirable spectrum, the passband frequency (stop-band frequency) of the bandpass filter 4 depends upon the frequency of the input signal $S_{IN}$, so that the characteristics of the circuit fluctuate in accordance with the input signal $S_{IN}$.

Figure 4B:
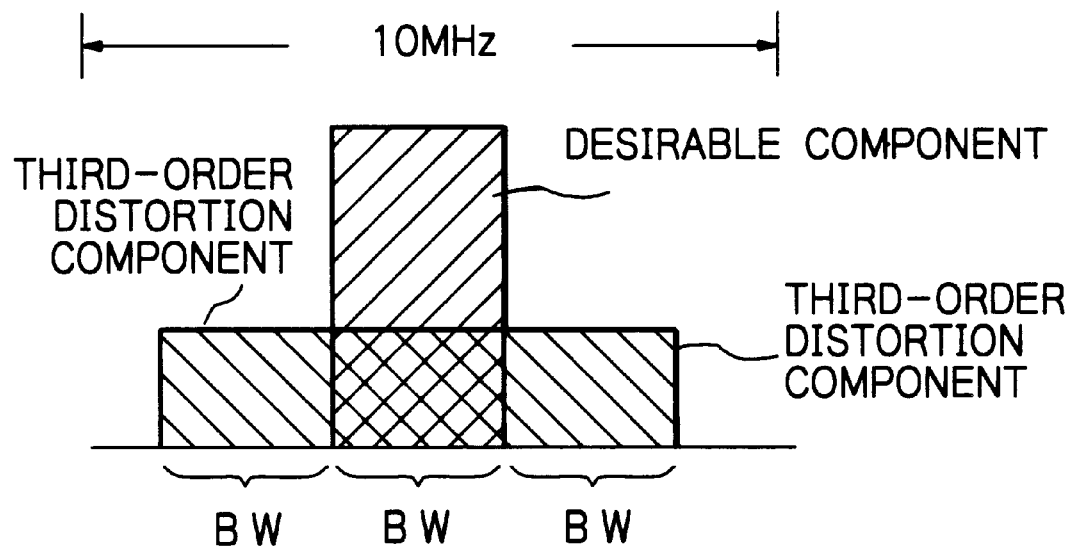

Another example of a frequency spectrum of the output signal $S_{OUT}$ is shown in FIG. 4B where a multi-QAM signal including a carrier whose bandwidth is BW is included in the input signal $S_{IN}$. In this case, a non-linear spectrum such as a third inter-modulation distortion spectrum have three times as large a bandwidth as that of a desirable spectrum. Therefore, since the frequencies of the non-linear spectrum are superposed onto those of desirable spectrum, the non-linear spectrum cannot be removed by the bandpass filter 4. As a result, it is difficult to control the predistortion circuit 1.

Figure 5:
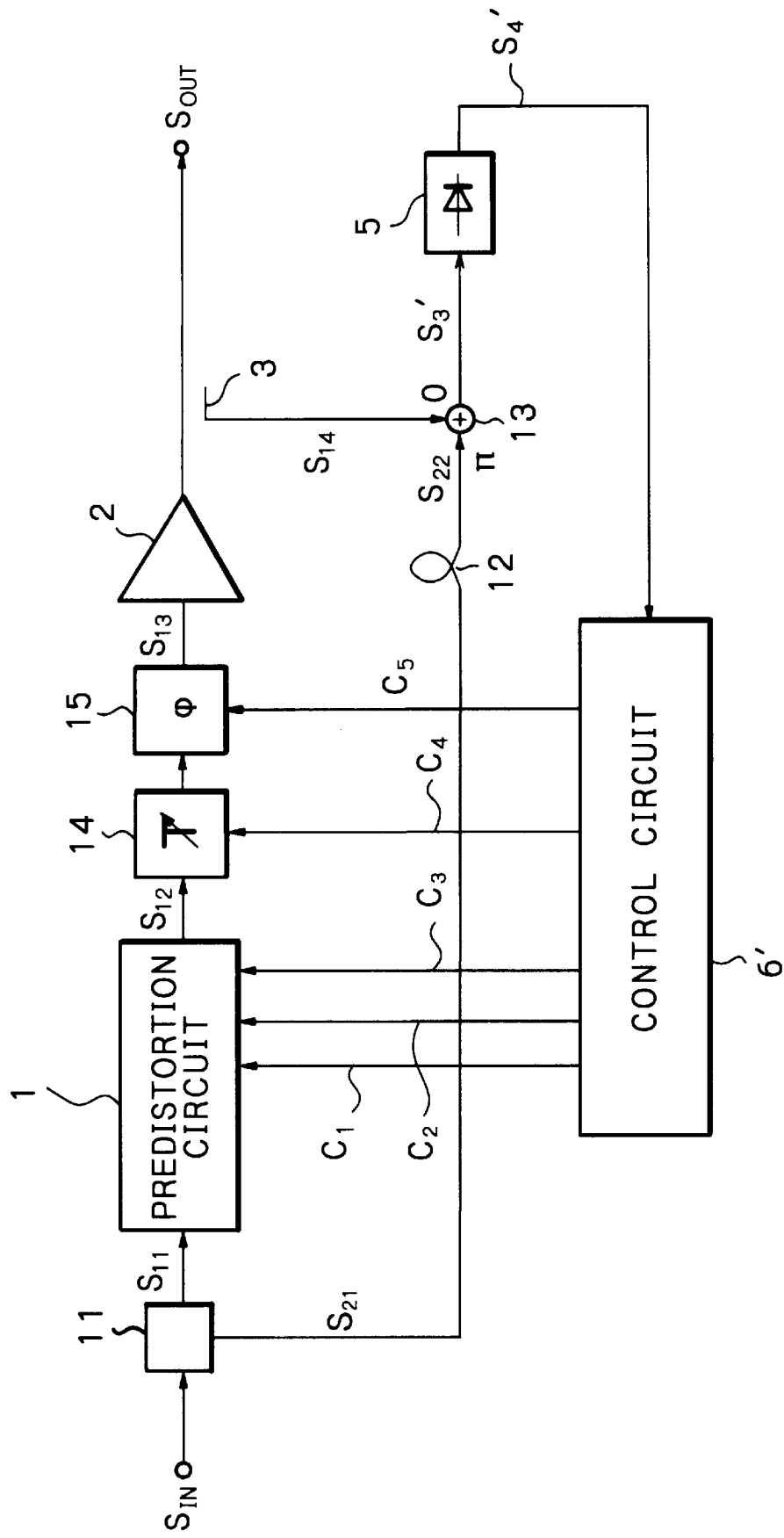
FIG. 5 is a circuit diagram illustrating a first embodiment of the automatic predistortion adjusting circuit according to the present invention.

In FIG. 5, which illustrates a first embodiment of the present invention, a splitter 11, a delay line 12 and an adder 13 are provided instead of the bandpass filter 4 of FIG. 1. In addition, a variable attenuator 14 and a variable phase shifter 15 are added between the predistortion circuit 1 and the main amplifier 2, to thereby adjust the delay of a signal propagated from the predistortion circuit 1 to the main amplifier 2.

In FIG. 5, an input signal $S_{IN}$ is split by the splitter 11 into signals $S_{1\,1}$ and $S_{21}$. The signal $S_{11}$ is supplied to the predistortion circuit 1, while the signal $S_{21}$ is supplied to the delay line 12.

The amplitude of the output signal $S_{12}$ of the predistortion circuit 1 is adjusted by the variable attenuator 14, and the phase of the output signal $S_{12}$ of the predistortion circuit 1 is adjusted by the variable phase shifter 15. Then, a signal $S_{13}$ passed through the variable attenuator 14 and the variable phase shifter 15 is amplified by the main amplifier 2 to generate an output signal $S_{OUT}$. Also, the directional coupler 3 branches a part of the output signal $S_{OUT}$ as a branch signal $S_{14}$, and transmits the branch signal $S_{14}$ to an input terminal of the adder 13.

On the other hand, the signal $S_{21}$ is delayed by the delay line 12, and is transmitted to the other input terminal of the adder 13.

The variable attenuator 14 and the variable phase shifter 15 are controlled by a control circuit 6' which receives an output signal $S_4'$ of the detector 5, so that the amplitude of the signal $S_{14}$ is brought close to that of the signal $S_{22}$ while the difference in phase therebetween is brought close to $\pi$, i.e., the phase of the signal $S_{14}$ is made opposite to that of the signal $S_{22}$.

Since the signal $S_{22}$ does not include a non-linear spectrum at all, an output signal $S_3'$ of the adder 13 includes only the non-linear spectrum of the branch signal $S_{14}$.

Thus, the control circuit 6' generates control signals $C_1$, $C_2$, $C_3$, $C_4$ and $C_5$ in accordance with the output signal $S_4'$ of the detector 5 to control the predistortion circuit 1, the variable attenuator 14 and the variable phase shifter 15, so that the level of the output signal $S_4'$ of the detector 5 is minimal, i.e., brought close to zero.

Figure 6:
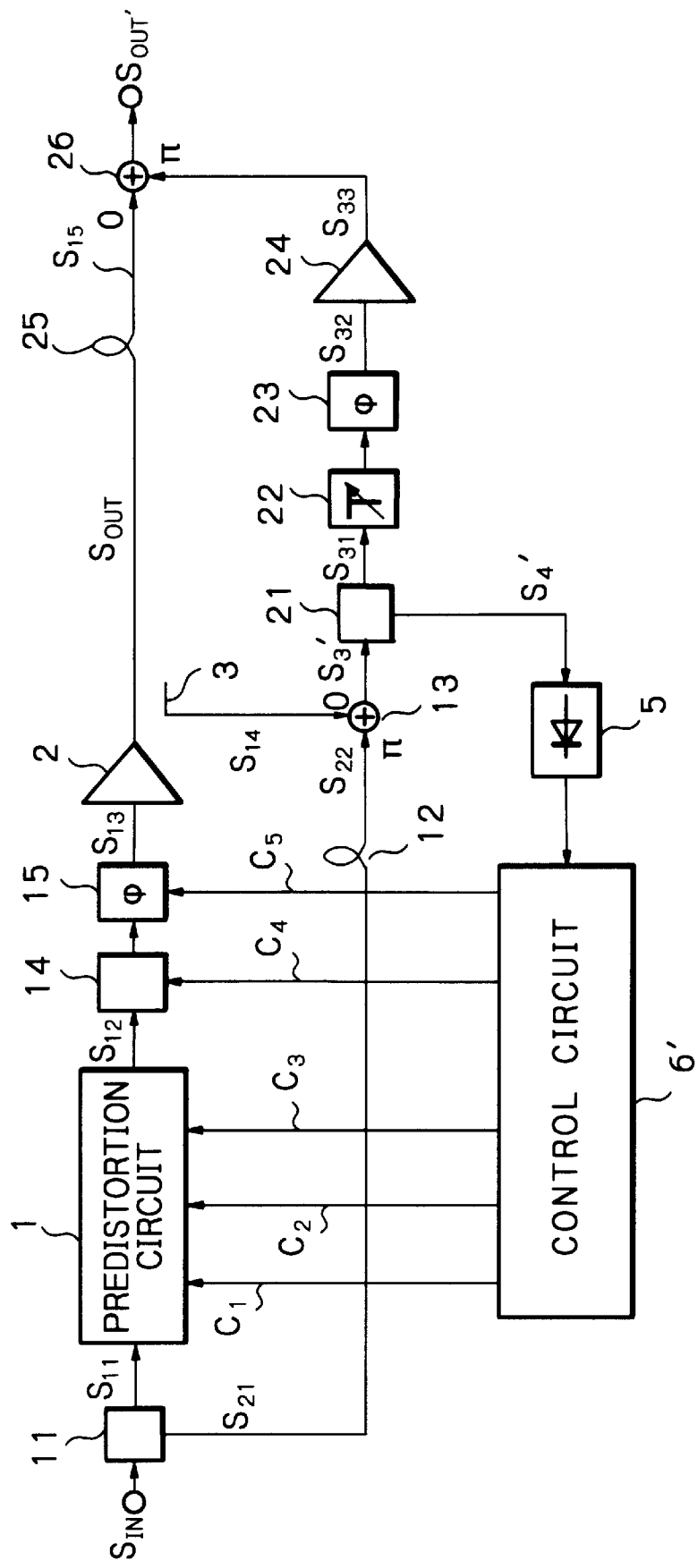
FIG. 6 is a circuit diagram illustrating a second embodiment of the automatic predistortion adjusting circuit according to the present invention.

In FIG. 6, which illustrates a second embodiment of the present invention, a splitter 21, a variable attenuator 22, a variable phase shifter 23, an error amplifier 24, a delay line 25, and an adder 26 are added as a feed forward configuration to the elements of FIG. 5. That is, the splitter 21 splits the signal $S_3'$ including only the non-linear spectrum into a signal $S_{31}$ and a signal $S_4'$. This signal $S_{31}$ is supplied to the feed forward configuration, while the signal $S_4'$ is supplied to the detector 5.

The amplitude of the signal $S_{31}$ is adjusted by the variable attenuator 22, and the phase of the signal $S_{31}$ is adjusted by the variable phase shifter 23. Then, a signal $S_{32}$ passed through the variable attenuator 22 and the variable phase shifter 23 is amplified by the error amplifier 24 to generate an output signal $S_{33}$. The signal $S_{33}$ is transmitted to an input terminal of the adder 26.

On the other hand, the signal $S_{OUT}$ is delayed by the delay line 25, and is transmitted to the other input terminal of the adder 26.

The variable attenuator 22 and the variable phase shifter 23 are adjusted in advance, so that the amplitude of the signal $S_{33}$ is brought close to that of the signal $S_{OUT}$ while the difference in phase therebetween is brought close to $\pi$, i.e., the phase of the signal $S_{33}$ is made opposite to that of the signal $S_{OUT}$.

Since the signal $S_{33}$ includes only the non-linear spectrum, so that the non-linear spectrum of the signal $S_{15}$ are compensated for by the signal $S_{33}$, an output signal $S_{OUT}'$ of the adder 26 includes only the desirable spectrum of the signal $S_{OUT}$.

The predistortion system incorporated in the circuit of FIG. 5 and the feed forward system added in the circuit of FIG. 6 compensate for the non-linear spectrum generated in the amplifier. In this case, the predistortion system carries out a coarse distortion compensation to reduce the distortion level from −20 dB to −30 dB, while the feed forward system carries out a fine distortion compensation to the distortion level from −20 dB to −60 dB. Therefore, in the above-described second embodiment, the two systems are combined to effectively reduce the distortion level.

As explained hereinabove, according to the present invention, only the non-linear characteristics can be completely extracted by a difference between the amplified output signal and the delay input signal, and the predistortion circuit is controlled by the extracted non-linear characteristics to carry out a predistortion compensation operation.

Therefore, the predistortion compensation operation is hardly affected by the frequency of the input signal.

I claim:

1. An automatic predistortion adjusting circuit comprising:

a first splitter for receiving an input signal and splitting said input signal into first and second signals;

a predistortion circuit, connected to said first splitter, for applying compensating non-linear characteristics to said first signal;

a first variable attenuator, connected to said predistortion circuit, for adjusting an amplitude of an output signal of said predistortion circuit;

a first variable phase shifter, connected to said first variable attenuator, for adjusting a phase of an output signal of said first variable attenuator;

a main amplifier, connected to said first variable phase shifter, for amplifying an output signal of said first variable phase shifter;

a directional coupler, connected to said main amplifier, for taking out a part of an output signal of said main amplifier as a branch signal;

a first delay line, connected to said splitter, for delaying said second signal to produce a delayed second signal;

a first adder, connected to said directional coupler, for adding said delayed second signal to said branch signal;

a detector, connected to said first adder, for detecting a strength of an output signal of said first adder; and a control circuit, connected to said detector, said predistortion circuit, said first variable attenuator and said first variable phase shifter, for controlling said compensating non-linear characteristics, an attenuation amount of said first variable attenuator and a phase amount of said first variable phase shifter in accordance with an output signal of said detector.

2. The circuit as set forth in claim 1, wherein said control circuit adjusts said compensating non-linear characteristics, so that a level of the output signal of said detector is brought close to zero.

3. The circuit as set forth in claim 1, wherein said control circuit adjusts the attenuation amount of said first variable attenuator, so that an amplitude of said branch signal is brought close to an amplitude of said delayed second signal.

4. The circuit as set forth in claim 1, wherein said control circuit adjusts the phase amount of said first variable phase shifter, so that a phase of said branch signal is made opposite to a phase of said delayed second signal.

5. The circuit as set forth in claim 1, further comprising a second splitter, connected between said first adder and said detector, for splitting the output signal of said first adder into third and fourth signals, said fourth signal being supplied to said detector;

a second variable attenuator, connected to said second splitter, for adjusting an amplitude of said third signal;

a second variable phase shifter, connected to said second variable attenuator, for adjusting a phase of an output signal of said second variable attenuator;

an error amplifier, connected to said second variable phase shifter, for amplifying an output signal of said second variable phase shifter;

a second delay line, connected to said main amplifier, for delaying the output signal of said main amplifier to produce a delayed main amplifier output signal; and a second adder, connected to said error amplifier and said second delay line, for adding said delayed main amplifier output signal to an output signal of said error amplifier.

6. The circuit as set forth in claim 5, wherein an attenuation amount of said second variable attenuator is adjusted, so that an amplitude of the output signal of said error amplifier is brought close to an amplitude of said delayed main amplifier output signal.

7. The circuit as set forth in claim 5, wherein a phase amount of said second variable phase shifter is adjusted, so that a phase of the output signal of said error amplifier is made opposite to a phase of said delayed main amplifier output signal.

8. A predistortion adjusting circuit comprising:

a splitter for receiving an input signal and splitting said input signal into first and second signals;

a circuit for predistorting, attenuating, and phase shifting the first signal in accordance with control signals which include compensating non-linear characteristics, an attenuation amount, and a phase shift amount;

a main amplifier connected to said circuit to amplify an output of said circuit; and a control circuit for varying the control signals based on a combined signal formed by adding a delayed second signal and a branch signal of the main amplifier output, wherein said circuit includes a predistorter, a variable attenuator, and a variable phase shifter connected in series.

9. The predistortion adjusting circuit as set forth in claim 8, wherein the predistorter applies the compensating non-linear characteristics to the first signal so that a level of the combined signal is brought close to zero.

10. The predistortion adjusting circuit as set forth in claim 9, wherein the variable attenuator adjusts an amplitude of the predistorter output by the attenuation amount, so that an amplitude of the third signal is brought close to an amplitude of the delayed second signal.

11. The predistortion adjusting circuit as set forth in claim 9, wherein the variable phase shifter adjusts a phase of the predistorter output by the phase shift amount, so that a phase of said third signal is made opposite to a phase of the delayed second signal.

12. The predistortion adjusting circuit as set forth in claim 8, further comprising:

a second splitter for receiving a combined signal and splitting the combined signal into third and fourth signals, the fourth signal being supplied to the control circuit;

a second variable attenuator and a second phase shifter for adjusting an amplitude and phase of the third signal;

an error amplifier for amplifying the amplitude and phase adjusted third signal to produce an amplified signal; and a signal combiner for adding a delayed output from the power amplifier to the amplified signal.

13. The predistortion adjusting circuit as set forth in claim 12, wherein the amplitude and the phase of the third signal are adjusted, so that an amplitude of the amplified signal is brought close to an amplitude of the delayed output from the main amplifier and a phase of the amplified signal is made opposite to a phase of the delayed main amplifier output.

14. A method for adjusting characteristics of the circuit having a predistorter, a variable attenuator, and a variable phase shifter connected in series, said method comprising the steps of:

splitting an input signal into first and second signals;

supplying the first signal to the circuit;

supplying an output of the circuit to a main amplifier;

branching a third signal from the main amplifier output;

delaying the second signal;

combining the delayed second signal to the third signal to produce a combined signal; and controlling the predistorter, the variable attenuator, and the variable phase shifter based on the combined signal.

15. The method as set forth in claim 14, wherein the step of controlling the predistorter includes the step of applying non-linear characteristics to the first signal so that a level of the combined signal is brought close to zero.

16. The method as set forth in claim 15, wherein the step of controlling the variable attenuator includes the step of adjusting an attenuation amount so that an amplitude of the third signal is brought close to an amplitude of the delayed second signal.

17. The method as set forth in claim 16, wherein the step of controlling he variable phase shifter includes the step of adjusting a phase shift amount so that a phase of said third signal is made opposite to a phase of the delayed second signal.

18. The method as set forth in claim 14, further comprising the steps of:

splitting the combined signal into fourth and fifth signals, said circuit being controlled in accordance with a strength of the fifth signal;

adjusting an amplitude and a phase of the fourth signal;

amplifying the amplitude and phase adjusted fourth signal to produce and amplified signal; and combining the amplified signal with a delayed output from the main amplifier.

19. The method as set forth in claim 18, wherein the amplitude and the phase of the fourth signal are adjusted, so that an amplitude of the amplified signal is brought close to an amplitude of the delayed output from the main amplifier and a phase of the amplified signal is made opposite to a phase of the delayed main amplifier output.

* * * * *